(12) United States Patent
Dellmann et al.

(10) Patent No.: US 7,724,988 B2
(45) Date of Patent: May 25, 2010

(54) OPTO-ELECTRONIC BOARD

(75) Inventors: Laurent A. Dellmann, Adliswil (CH); Michel Despont, Au (CH); Bert J. Offrein, Schoenenberg (CH); David J. Webb, Rüschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/927,589

(22) Filed: Oct. 29, 2007

(65) Prior Publication Data

US 2008/0247706 A1 Oct. 9, 2008

Related U.S. Application Data

(63) Continuation of application No. 11/615,838, filed on Dec. 22, 2006, now Pat. No. 7,336,864.

(30) Foreign Application Priority Data

Dec. 23, 2005 (EP) .................................. 05112948

(51) Int. Cl.
*G02B 6/12* (2006.01)
*H01L 21/00* (2006.01)
(52) U.S. Cl. ........................... 385/14; 385/92; 385/129; 385/130; 385/49; 438/29; 438/31
(58) Field of Classification Search ................. 385/14, 385/31, 52, 49, 88, 89, 92, 93, 94, 129, 130, 385/131, 132; 438/29, 31
See application file for complete search history.

(56) References Cited

U.S. PATENT DOCUMENTS

| 4,732,446 | A | * | 3/1988 | Gipson et al. | 385/24 |
| 5,271,083 | A | * | 12/1993 | Lebby et al. | 385/130 |
| 5,309,537 | A | * | 5/1994 | Chun et al. | 385/59 |
| 5,511,138 | A | * | 4/1996 | Lebby et al. | 385/14 |
| 5,521,992 | A | * | 5/1996 | Chun et al. | 385/14 |
| 6,759,687 | B1 | * | 7/2004 | Miller et al. | 257/98 |
| 7,336,864 | B2 | * | 2/2008 | Dellmann et al. | 385/14 |
| 2007/0147729 | A1 | * | 6/2007 | Dellmann et al. | 385/14 |
| 2008/0247706 | A1 | * | 10/2008 | Dellmann et al. | 385/14 |

FOREIGN PATENT DOCUMENTS

CN 1685282 10/2005

\* cited by examiner

*Primary Examiner*—Brian M Healy
(74) *Attorney, Agent, or Firm*—Ido Tuchman; Kenneth R. Corsello

(57) ABSTRACT

An opto-electronic board including a printed wiring board with an optical waveguide, a metallic area, and a hole, wherein an abutting face of the optical waveguide and an abutting face of the metallic area form a part of the side face of the hole. The opto-electronic board further comprises an opto-electronic circuit with a bonding pad, wherein the opto-electronic circuit is arranged in the hole and soldered with its bonding pad to the abutting face of the metallic area.

17 Claims, 2 Drawing Sheets

OPTO-ELECTRONIC BOARD

CROSS-REFERENCE TO RELATED APPLICATIONS

This application is a continuation under 35 U.S.C. §120 of U.S. patent application Ser. No. 11/615,838 for OPTO-ELECTRONIC BOARD, filed Dec. 22, 2006, now U.S. Pat. No. 7,336,864 which claims priority under 35 U.S.C. §119 to European Patent Application No. 05112948.4 filed Dec. 23, 2005, the entire text of which is specifically incorporated by reference herein.

BACKGROUND OF THE INVENTION

The present invention relates to an opto-electronic board and to a method of mounting an opto-electronic circuit on a hybrid printed circuit board. The hybrid printed circuit board comprises an optical waveguide and electrical tracks.

The transmission of high frequency signals over distances of 1 to 3 meters on printed wiring boards (PWB) and through several connectors, with low loss and distortion is desired in several applications such as high-speed servers and routers. As the signal frequencies are now in the 10 GHz range this is becoming increasingly difficult to accomplish electrically, mainly because of the dielectric losses of the insulating materials in the circuit board. Even if lower loss dielectric materials can be employed, as frequencies increase further, the resistance of the copper wiring of the PWB will eventually become a limiting factor.

One solution to this problem could be to transmit the higher frequency signals over the longer distances optically rather than electrically. This can be done by integrating optical waveguides in the printed wiring board. The waveguides carry optical signals in the plane of the PWB. The high frequency electrical signals are converted by means of opto-electronic converters into optical signals, coupled into a waveguide, integrated into the wiring board, transmitted to their destination (possibly also through several optical connectors) with low loss and distortion, coupled out of the waveguide and then converted back into electrical signals by means of further opto-electronic converters. The required mechanical tolerances of the placement of the emitters and detectors of the opto-electronic converters relative to the waveguide are of the order of a few micrometers, preferably <5 μm. This leads to the problem of mounting the opto-electronic converters relative to the waveguide so that the light can be efficiently coupled in and out of the waveguide.

In the patent application WO 2005/031417A1 a printed circuit board with electrical tracks and an integrated optical waveguide is described. An opto-electronic circuit is mounted on the surface of the printed circuit board and is optically coupled to the optical waveguide via an opening in the printed circuit board. Light is coupled out of the optical waveguide and directed to the opto-electronic circuit by turning round the light with 90° at the end face of the optical waveguide. Therefore, the end face of the optical waveguide is sloped.

In the publication R. T. Chen, L. Lin, C. Choi, Y. J. Liu, B. Bihari, L. Wu, S. Tang, R. Wickman, B. Picor, M. K. Hibbs-Brenner, J. Bristow, Y. S. Liu, "Fully Embedded Board-Level Guided-Wave Optoelectronic Interconnects," Proc. IEEE, Vol. 88, No. 6, pp. 780-793, June 2000, a printed circuit board is described with embedded optical waveguides and embedded optoelectronic elements. The optoelectronic elements are mounted on the surface of the optical waveguide layer. Mirrors embedded in the waveguide redirect the light to obtain efficient optical coupling between the optoelectronic elements and the optical waveguides. The realization of mirrors in the waveguide layer is a specialized process that increases the cost of the optical board.

In the publication G. K. Chang, D. Guidotti, Z. Huang, L. Wan, J. Yu, S. Hegde, H. F. Kuo, Y. J. Chang, F. Liu, F. Wang R. Tummala, "High-density, end-to-end optoelectronic integration and packaging for digital-optical interconnect systems," Proc. SPIE Conf. on Enabling Photonics Technologies for Defense, Security and Aerospace Applications, 28 Mar.-1 Apr., 2005, Kissimmee, Fla., USA, Vol. 5814, (Paper 24), it is described how edge emitting lasers and edge receiving detectors are embedded in cavities in the waveguide layer to obtain a butt coupled optical interface to the waveguide facet. This approach avoids the use of mirrors but requires edge emitting lasers, which are generally more expensive than surface emitting lasers. Furthermore, edge receiving detectors are not available as standard components.

In the patent application WO 2005/096682 A2 the opto-electronic elements are embedded in the printed circuit board, where the surface emitting lasers and the detectors are oriented vertically. This arrangement also overcomes the requirement for waveguide embedded mirrors and enables a butt coupled optical interface to the waveguide end-facet. The electrical contacts to the optoelectronic element are obtained through microvias in the printed circuit board. Alternative options to establish the electrical connections between the printed circuit board and the optoelectronic element are by means of a flexible electrical sheet or by wire bonding. The precise positioning of the optoelectronic element with respect to the waveguides is obtained through mechanical alignment features in the board and on the optoelectronic element.

BRIEF SUMMARY OF THE INVENTION

According to a first exemplary aspect of the invention there is provided an opto-electronic board with a waveguide and an opto-electronic circuit, wherein the opto-electronic circuit is aligned relative to the waveguide so that the light can be more efficiently coupled in and out of the waveguide. With the help of the invention the opto-electronic circuit can be mechanically better located.

There may be provided electrical connections between the transmitter or receiver of the electronic signals and the opto-electronic circuit. With this embodiment, the electrical connections can be kept shorter and loss and distortion can be reduced.

The opto-electronic board may comprise a printed wiring board with an optical waveguide, a metallic area, and a hole, wherein an abutting face of the optical waveguide and an abutting face of the metallic area form a part of the side face of the hole. The opto-electronic board further comprises an opto-electronic circuit with a bonding pad, wherein the opto-electronic circuit is arranged in the hole and soldered with its bonding pad to the abutting face of the metallic area.

Advantageous further developments of the embodiment arise from the characteristics indicated in the dependent patent claims below.

Preferably, in the opto-electronic board the bonding pad of the opto-electronic circuit has substantially the same height as the height of the abutting face of the metallic area. Thus, the vertical accuracy of the alignment of the opto-electronic circuit with respect to the waveguide can be further increased.

Furthermore, in an embodiment of the opto-electronic board, the bonding pad of the opto-electronic circuit has substantially the same width as the width of the abutting face of the metallic area. Thus, the horizontal accuracy of the alignment of the opto-electronic circuit with respect to the waveguide can be further increased.

In an embodiment of the opto-electronic board the opto-electronic circuit comprises a light emitting or detecting element, wherein the distance between the light emitting or detecting element and the bonding pad and the distance between the metallic area and the core of the optical waveguide are chosen such that an optical coupling between the light emitting or detecting element and the optical waveguide is provided.

In a further embodiment of the opto-electronic board the hole extends over the entire thickness of the printed wiring board. This makes it easier to manufacture the hole.

In another embodiment of the opto-electronic board the metallic area covers the optical waveguide. With that, the accuracy of the alignment of the opto-electronic circuit can be enhanced, because the tolerances of the layers increase with every further layer.

In a development of the opto-electronic board, the metallic area is formed such that it serves as electrical conductor for the opto-electronic circuit. Thus, the metallic area or areas serve as mechanical positioning aid and as conductors for electrical signals.

According to a further embodiment of the opto-electronic board the printed wiring board comprises further metallic areas and the opto-electronic circuit comprises further bonding pads, wherein the abutting faces of the further metallic areas form a further part of the side face of the hole and are arranged opposite to the further bonding pads of the opto-electronic circuit. With that, the self alignment of the opto-electronic circuit can be further enhanced, because each further metallic area improves during the soldering process the self-alignment of the opto-electronic circuit.

Advantageously, in the opto-electronic board the opto-electronic circuit comprises a carrier, wherein the light emitting or detecting element and the bonding pads are arranged on the carrier.

Finally, in the opto-electronic board the metallic area can comprise a first metal and the abutting face of the metallic area can be coated with a different metal, such as gold or nickel. The coating metal serves as diffusion barrier.

According to another aspect of the invention, a method is provided for manufacturing the above mentioned board, wherein the method comprises the following steps. In a positioning step the opto-electronic circuit is positioned in the hole. Then, in a soldering step the bonding pads of the opto-electronic circuit are soldered to the abutting faces of the metallic areas.

In order to relax the mechanical tolerances of the placement of the emitters and detectors of the opto-electronic converters relative to the waveguide the waveguide can be multimode.

DETAILED DESCRIPTION OF THE INVENTION

Figure 1:
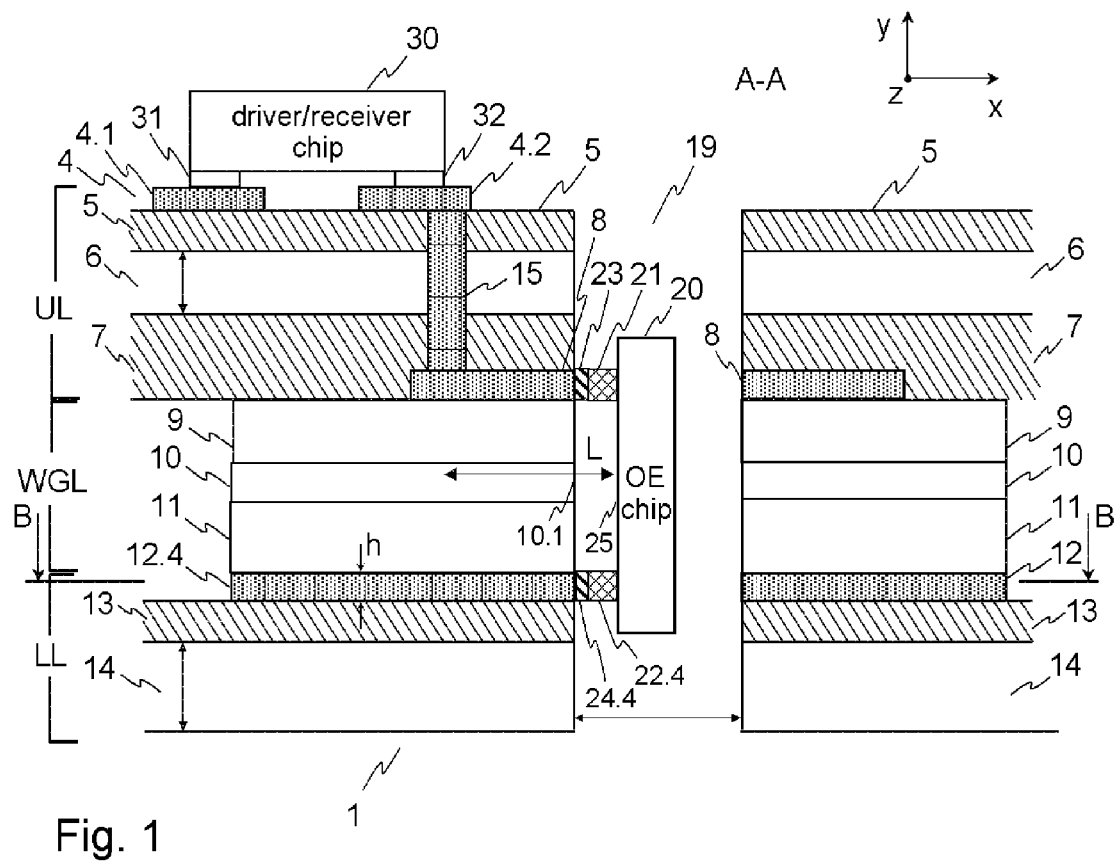
FIG. 1 illustrates an opto-electronic board with a printed wiring board equipped with two chips in cross section, with a top-emitting VCSEL.
Figure 2:
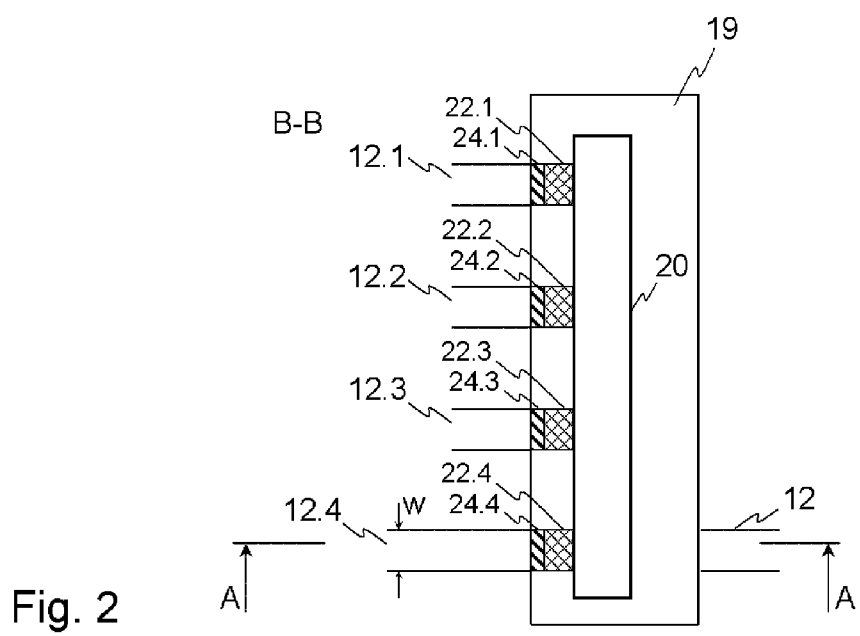
FIG. 2 illustrates the opto-electronic board of FIG. 1 in longitudinal section.

FIG. 1 illustrates a first embodiment of the opto-electronic board with a printed wiring board 1 in cross section. The intersection runs along the intersecting line A-A which is depicted in FIG. 2. FIG. 2 illustrates a clipper of the opto-electronic board 1 in longitudinal section along the intersecting line B-B which is depicted in FIG. 1.

The printed wiring board 1 is equipped with two chips. One of the two chips is a driver/receiver chip 30 which is mounted on top of the printed wiring board 1. The driver/receiver chip 30 has bonding pads soldered to wiring tracks of the printed wiring board 1. In FIG. 1 two of the bonding pads, indicated with the reference signs 31 and 32, are depicted. The second chip is an opto-electrical circuit 20, which is mounted in a hole 19 of the printed wiring board 1. The expressions opto-electrical circuit, opto-electrical (O/E) converter chip, electro-optical (E/O) converter chip, or shortly converter chip are used in the following as synonyms. The printed wiring board 1, which is also called printed circuit board, comprises a copper layer 4 having copper wiring tracks 4.1 and 4.2, also called strip conductors, and further copper layers 8 and 12. The copper layers 4, 8 and 12 are separated by insulating layers 5, 7 and 13 of glass-reinforced plastic. The copper layers 8 and 12 have one or more metallic areas, where each of the metallic areas has a abutting face which forms a part of the side face of the hole 19 in the printed wiring board 1. For example, the layer 12 comprises the metallic areas 12.1 to 12.4. The abutting faces of the metallic areas 12.1 to 12.4 and the abutting faces of metallic areas of layer 8 can be coated with e.g. gold or nickel to prevent oxidation and to provide an improved surface for a good solder bond. The reference signs 6 and 14 denote further layers, which may comprise further copper and insulating layers. Electrical interconnection between the wiring tracks 4.2 and 8 is made by a copper via 15 through the intervening insulating layers 5 and 7. An optical waveguide (OWG) comprising an upper cladding layer 9, an optical waveguide core layer 10, and a lower cladding layer 11, is placed between the upper layers UL, comprising the layers 4, 5, 6 and 7, and the lower layers LL, comprising the layers 13 and 14. The upper cladding layer 9, the optical waveguide core layer 10, and the lower cladding layer 11 are combined to waveguide layers WGL.

Figure 3:
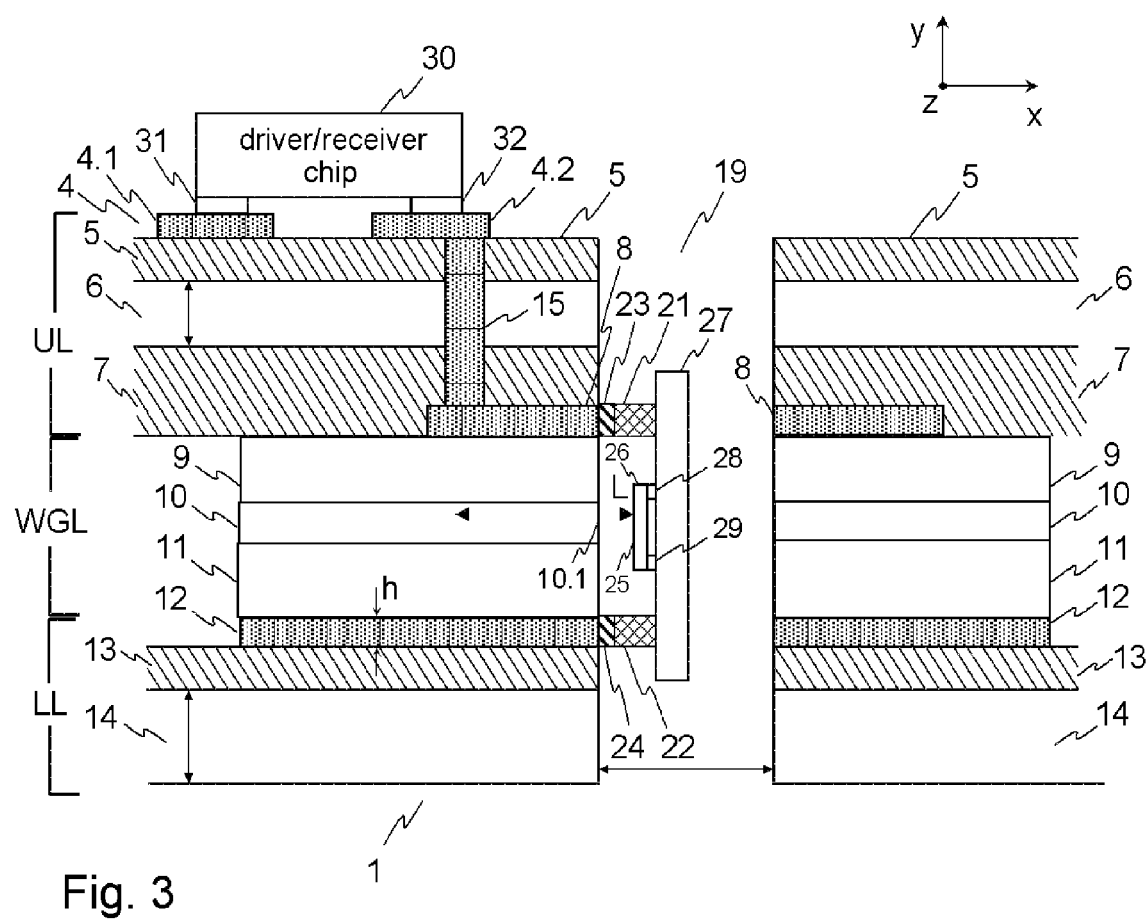
FIG. 3 illustrates an opto-electronic board with a printed wiring board equipped with two chips in cross section, with a bottom-emitting VCSEL.

FIG. 3 illustrates a second embodiment of the opto-electronic board with the printed wiring board 1 equipped with two chips in cross section. The second embodiment differs from the first one with respect to the construction of the opto-electrical circuit 20. While the opto-electrical circuit depicted in FIG. 1 is a top emitting VCSEL, the opto-electrical circuit depicted in FIG. 3 is a bottom emitting VCSEL. A VCSEL (Vertical Cavity Surface Emitting Laser) is a optical light emitting device. The opto-electrical circuit of FIG. 3 comprises a carrier 27 with several bonding pads 21 and 22 and a bottom emitting VCSEL 26. The VCSEL 26 is electrically and mechanically connected via bonding pads 28 and 29 to the carrier 27.

In another embodiment the opto-electrical circuit can also be a light detecting circuit, such as a photo resistor.

To ensure that the finished printed wiring board 1 is substantially flat it is advantageous that the arrangement of the layers UL, WGL and LL is symmetrical about the center layer. For this reason the layers 9, 10 and 11 of the optical waveguide are preferably placed midway between the top or upper layers UP and the bottom or lower layers LL of the printed wiring board 1.

It is desired to mount the opto-electronic converter chip 20 in such a way that light can be coupled into or out of optical waveguides which are laminated into the printed wiring board 1. Therefore, holes, wherein one of them is shown in FIG. 1-3, are cut in the printed wiring board 1 to expose end faces, also called abutting faces, of the OWG's laminated within the printed wiring board 1. An OE detector chip is mounted into the hole so that light emitted from the end faces of these OWG(s) is coupled into the detector(s). Conversely, a light emitting chip is mounted in such a hole so that the emitted light of the laser(s) or LED(s) of the light emitting chip is coupled into the end faces of the OWG's. Therefore, the OE chips are bonded directly to the sidewalls of the hole in the printed wiring board 1. By bonding the OE chip to the end faces of the copper wiring tracks a higher degree of alignment is attained. These wiring tracks are embedded in the board and aligned to the OWG's as part of the manufacturing process for the printed wiring board. The same wiring tracks can be used to carry the electrical signals between the OE chip and other devices such as the driver 30 on the printed wiring board 1.

The OE chip 20 is so formed that when it is bonded to the copper layers above or/and below the OWG its optically emitting or receiving surface is precisely aligned, i.e. within a <5 micrometers with respect to the core layer 10 of the OWG to which it couples. This alignment parallel to the plane of the edge of the cut in the printed wiring board is by the geometry of the chip and of the copper tracks in the printed wiring board. The distance of the light emitting surface of the chip from the OWG is given by the bonding thickness 23, 24 and construction of the bonding pads 21, 22 on the OE chip. Whether the OE chip is bonded to the copper layers on only one side or both sides of the OWG is optional and would be decided based on thermal, mechanical, optical or electrical issues of the devices being considered.

The opto-electronic chip can be soldered to the abutting faces of the metallic areas by means of balls of solder. Further information about chip-joining, for example by means of balls of solder, can be found in Karl Puttlitz, Paul A. Totta, "Area Array Interconnection Handbook", Kluwer Academic Publishers (Boston, Dordrecht, London), 2001, ISBN 0-7923-7919-5.

In an embodiment the bonding pads 22 of the opto-electronic circuit 20 have substantially the same height h as the height of the abutting face of the metallic area 12. In principle, the same applies for further bonding pads of the opto-electronic circuit 20 and further abutting faces of metallic areas, e.g. layer 8, of the printed wiring board 1. Thus, the vertical accuracy, i.e. the accuracy in y-direction, of the alignment of the opto-electronic circuit 20 with respect to the waveguide can be further increased.

In a further embodiment the bonding pads 22 of the opto-electronic circuit 20 have substantially the same width w as the width of the abutting face of the metallic area 12. In principle, the same applies for further bonding pads of the opto-electronic circuit 20 and further abutting faces of metallic areas, e.g. layer 8, of the printed wiring board 1. Thus, the horizontal accuracy, i.e. the accuracy in z-direction, of the alignment of the opto-electronic circuit 20 with respect to the waveguide can be further increased.

The light emitting or detecting surface of the electro-optical converter chip 20 is situated on a face 25 of the converter chip 20, which is facing to the light emitting or receiving face 10.1 of the waveguide core layer 10. The face 10.1 is one of the above mentioned abutting faces. On the same face 25 of the converter chip 20 are also placed conducting pads 21 and 22 which are of a substantially same height relative to the light emitting or detecting surface of the electro-optical converter 20. The pads (reference signs 21 and 22 indicate two of them) make the electrical connection to the electro-optical converter on the chip 20. The pads 21 and 22 are so formed with a suitable metallurgy, e.g. solder 23 and 24, that they can be bonded to the copper wiring tracks 8 and 12 respectively of the printed wiring board. Some treatment, e.g. cleaning, plating of another metal, e.g. gold or nickel, etc., of the exposed surfaces of the copper tracks 8 and 12 may be helpful to make a better bond.

In the sequence of layers of the printed wiring board 1, the copper layers 8 and 12 are situated immediately above and below the optical waveguide layers 9, 10 and 11. The copper layers 8 and 12 locate the position of the waveguide 9, 10, 11 within the layer stack with higher accuracy. Therefore, the copper layers 8 and 12 are preferred to locate the position of the waveguide layers 9, 10, 11. The reason for it is that because of the manufacturing process the thickness of the entire layer stack, i.e. the thickness of the entire printed wiring board 1, varies more than the entire thickness of the optical waveguide layers 9, 10 and 11 and the copper layers 8 and 12. The entire thickness of the stack, consisting of optical waveguide layers 9, 10 and 11 and copper layers 8 and 12, is therefore more precisely predictable than the thickness of the entire printed wiring board.

At each location where a coupling to the waveguide 9, 10, 11 is desired, a hole is cut in the printed wiring board, preferably at least one having a planar edge, which reaches from one surface of the printed wiring board to at least through to the copper layer bounding the opposite side of the waveguide 9, 10, 11. The hole can for example be cut completely through the printed wiring board 1 as depicted in FIGS. 1 and 3. This hole 19 exposes a cross-section through the printed wiring board. In particular the hole 19 exposes a perpendicular section through the waveguide 9, 10, 11 into or out of which light L can be coupled. Secondly, the hole 19 exposes the copper wiring tracks 8 and 12 above and below the waveguide 9, 10, 11 to which the opto-electrical converter chip 20 can be bonded and which electrically connect it to the rest of the circuit. It is recognized that laser cutters can stop on metal layers and so can cut holes with a predetermined depth.

The copper layers 8 and 12 immediately on the top and bottom of the waveguide 9, 10, 11 are so formed as to have two functions. First, the bonding pads 21 and 22 on the electro-optical converter chip 20 will be bonded directly to the copper layers 8 and 12 respectively. The copper layers 8 and 12 are precisely situated also laterally (in y- and z-direction) relative to the optical waveguide 9, 10, 11. If solder 23, 24 is used as a bonding material (as in flip-chip bonding) surface tension of the molten solder will provide some degree of self-alignment of the pads 21 and 22 on the electro-optical converter chip 20 to the copper features on the printed wiring board 1. Secondly, the wiring tracks 8 and 12 perform the wiring function in combination with the hole 19 so that the electrical signals are carried to and from the electro-optical converter chip 20 through a shorter path to the adjacent electrical driver and receiver chip 30.

The electro-optical converter chip 20 is so formed that when it is bonded to the copper layers 8 and 12 above or/and below the optical waveguide 9, 10, 11 its optically emitting or receiving surface 25 is aligned to preferably within less than 5 micrometers with respect to the core of the optical waveguide 9, 10, 11 to which it couples. This alignment parallel to the plane of the edge of the cut in the printed wiring board is by the geometry of the chip and of the copper tracks 8 and 12 in the printed wiring board. The distance of the emitting surface from the optical waveguide 9, 10, 11 is given by the bonding thickness and construction of the bonding pads on the electro-optical converter chip 20.

What is here described as an electro-optical chip 20 could also be a passive micro-optical component such as a combination of lenses, beam-benders or splitters etc. Such a passive optical element could be used to couple light in/out of the waveguide 9, 10, 11 and guide it to the surface of the printed wiring board. Once there the light could be routed to/from detectors or emitters or into optical connectors. The principle of location and mounting using bonding pads on the component and the copper surfaces exposed by cutting through the printed wiring board remain the same however.

Further, what is here described as an electro-optical chip 20 could be a composite structure comprising, for instance, a light detector chip and an amplifier chip and possibly also a flexible structure for strain relief. The principle of location and mounting using bonding pads on the component and the copper surfaces exposed by cutting through the printed wiring board, and the principle of possibly using the wiring tracks in the printed wiring board to make electrical connection to the electro-optical converter chip remain the same however.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having thus described the invention of the present application in detail and by reference to embodiments thereof, it will be apparent that modifications and variations are possible without departing from the scope of the invention defined in the appended claims.

That which is claimed is:

1. An opto-electronic board, comprising:
    a printed wiring board with an optical waveguide, a metallic area, a hole, wherein an abutting face of the optical waveguide and an abutting face of the metallic area form a part of the side face of the hole, and
    an opto-electronic circuit with a bonding pad, wherein the opto-electronic circuit is arranged in the hole and bonded with a bonding pad to the abutting face of the metallic area, and
    wherein the bonding pad has substantially the same height as the height of the abutting face of the metallic area.

2. An opto-electronic board, comprising:
    a printed wiring board with an optical waveguide, a metallic area, a hole, wherein an abutting face of the optical waveguide and an abutting face of the metallic area form a part of the side face of the hole, and
    an opto-electronic circuit with a bonding pad, wherein the opto-electronic circuit is arranged in the hole and bonded with a bonding pad to the abutting face of the metallic area, and
    wherein the bonding pad has substantially the same width as the width of the abutting face of the metallic area.

3. The opto-electronic board according to claim 1, wherein the opto-electronic circuit comprises a light emitting element, wherein the distance between the light emitting element and the bonding pad and the distance between the metallic area and the core of the optical waveguide are selected in such a way that an optical coupling between the light emitting element and the optical waveguide is provided.

4. The opto-electronic board according to claim 3,
    wherein the opto-electronic circuit comprises a carrier, and
    wherein the light emitting element and the bonding pads are arranged on the carrier.

5. The opto-electronic board according to claim 1, wherein the opto-electronic circuit comprises a light detecting element, wherein the distance between the light detecting element and the bonding pad and the distance between the metallic area and the core of the optical waveguide are selected in such a way that an optical coupling between the light detecting element and the optical waveguide is provided.

6. The opto-electronic board according to claim 5,
    wherein the opto-electronic circuit comprises a carrier, and
    wherein the light emitting or detecting element and the bonding pads are arranged on the carrier.

7. The opto-electronic board according to claim 1, wherein the hole extends over the entire thickness of the printed wiring board.

8. The opto-electronic board according to claim 1, wherein the metallic area covers at least part of the optical waveguide.

9. The opto-electronic board according to claim 1, wherein the metallic area is formed such that it serves as electrical conductor for the opto-electronic circuit.

10. The opto-electronic board according to claim 1:
    wherein the printed wiring board comprises further metallic areas,
    wherein the opto-electronic circuit comprises further bonding pads, and
    wherein the abutting faces of the further metallic areas form a further part of the side face of the hole and are arranged opposite to the further bonding pads of the opto-electronic circuit.

11. An opto-electronic board, comprising:
    a printed wiring board with an optical waveguide, a metallic area, a hole, wherein an abutting face of the optical waveguide and an abutting face of the metallic area form a part of the side face of the hole, and
    an opto-electronic circuit with a bonding pad, wherein the opto-electronic circuit is arranged in the hole and bonded with a bonding pad to the abutting face of the metallic area, and
    wherein the metallic area comprises a first metal and the abutting face of the metallic area is coated with a different metal.

12. The opto-electronic board according to claim 1, wherein instead of the opto-electronic circuit a micro-optical component is provided.

13. A method for manufacturing an opto-electronic board, the opto-electronic board comprising a printed wiring board with an optical waveguide, a metallic area comprising a first metal, a hole, wherein an abutting face of the optical waveguide and an abutting face of the metallic area form a part of the side face of the hole, and an opto-electronic circuit with a bonding pad, wherein the opto-electronic circuit is arranged in the hole and soldered with a bonding pad to the abutting face of the metallic area, the method comprising:

positioning the opto-electronic circuit in the hole, soldering the bonding pads of the opto-electronic circuit to the abutting faces of the metallic areas, and coating the abutting face of the metallic area with a different metal from the first metal.

14. The opto-electronic board according to claim 1, wherein bonding comprises soldering.

15. The opto-electronic board according to claim 1, wherein a geometry of the opto-electronic circuit is aligned parallel to a plane of an edge of a cut in the printed wiring board.

16. The opto-electronic board according to claim 1, wherein the opto-electronic circuit further comprises a flexible structure for strain relief.

17. The opto-electronic board according to claim 1, wherein a first metallic layer comprising the metallic area is separated from a second metallic layer by an insulating layer of glass-reinforced plastic.

* * * * *